(12) United States Patent
Demone

(10) Patent No.: US 6,707,734 B2
(45) Date of Patent: Mar. 16, 2004

(54) METHOD AND CIRCUIT FOR ACCELERATING REDUNDANT ADDRESS MATCHING

(75) Inventor: Paul Demone, Kanata (CA)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 10/336,849

(22) Filed: Jan. 6, 2003

(65) Prior Publication Data

US 2003/0151437 A1 Aug. 14, 2003

Related U.S. Application Data

(63) Continuation of application No. PCT/CA01/01409, filed on Nov. 30, 2000.
(60) Provisional application No. 60/216,684, filed on Jul. 7, 2000.

(51) Int. Cl.[7] ................................................. G11C 7/00
(52) U.S. Cl. ..................... 365/200; 365/189.07; 327/57
(58) Field of Search ........................... 365/200, 189.07, 365/189.05, 189.06, 190, 191, 233; 327/57, 63, 64, 76

(56) References Cited

U.S. PATENT DOCUMENTS

| | | | |
|---|---|---|---|
| 5,289,413 A | * | 2/1994 | Tsuchida et al. ........ 365/189.02 |
| 5,640,365 A | | 6/1997 | Imamiya et al. |
| 5,841,712 A | | 11/1998 | Wendell et al. |
| 6,400,617 B1 | * | 6/2002 | Aikawa et al. ............. 365/200 |

FOREIGN PATENT DOCUMENTS

| | | |
|---|---|---|
| EP | 0 881 571 | 12/1998 |
| EP | 0 929 036 | 7/1999 |

* cited by examiner

*Primary Examiner*—Richard Elms
*Assistant Examiner*—Hien Nguyen
(74) *Attorney, Agent, or Firm*—Kevin Pillay; Oligvy Renault

(57) ABSTRACT

There is provided a latched comparison circuit for generating complementary latched output signals. The latched comparison circuit includes a comparator circuit for comparing an input address with a redundant address for generating a comparison output signal. The latched comparison circuit further includes a flip-flop circuit coupled to the comparison output signal for latching the comparison output signal and for providing complementary latched comparison output signals in response to a clock signal.

13 Claims, 6 Drawing Sheets

| OPERATION | $\overline{RA1}_i$ | $\overline{RA0}_i$ |
|---|---|---|
| Compare $A_i = 0$ | 1 | 0 |
| Compare $A_i = 1$ | 0 | 1 |
| Disable | 1 | 1 |

METHOD AND CIRCUIT FOR ACCELERATING REDUNDANT ADDRESS MATCHING

This application is a Continuation Application from PCT International Application No. PCT/CA01/01409, filed Nov. 30, 2000, which claims priority from Canadian Application Serial No. 2,313,952, filed Jul. 7, 2000 and U.S. application Ser. No. 60/216,684, filed Jul. 7, 2000.

The present invention relates generally to semiconductor devices having redundant elements for replacing defective elements and specifically to a circuit and method for accelerating accesses to and from such devices.

BACKGROUND OF THE INVENTION

The use of redundant memory elements in dynamic random access memory (DRAM) is widespread because it allows acceptable manufacturing yields of large memory devices even with aggressive semiconductor process design rules. Common industry practice includes extra rows and columns within memory arrays. The extra rows and columns are selectively substituted for memory elements within the array that are found to be defective during testing of the memory array. Therefore, many memory devices that otherwise would have rendered flawed by one or more point defects can be repaired and made fully operative.

The replacement of defective memory elements with redundant memory elements is controlled by address decoding logic which detects specific defective addresses or defective address ranges and redirects memory accesses to redundant memory elements. Typically, this capability is implemented by adding comparator circuits for detecting an equality between a portion of the memory access address and specific values (referred to as a redundant row address) permanently set in a repaired device. These specific values are permanently set in the repaired device at test time by laser programmable fuses and the like. When the address comparator detects an access to a defective memory element, special logic suppresses the regular access mechanism and a redundant element is accessed instead.

Referring to FIG. 1, the traditional approach to implementing row redundancy in a synchronous interface DRAM device is shown generally by numeral 100. The address input to a memory is captured in a register 102. The row selection (or X) portion of the address output from the register 102 is sent to a number of redundant row address comparators, C1 and C2 (only two are shown for simplicity), as well as to an X-address predecoder block 103. Each of the redundant row address comparators C1 and C2 has redundant row addresses R1 and R2 as its second input value. If the input row address is equivalent to one of the redundant row addresses, the comparator for that particular redundant address activates its associated output line, OL1 or OL2. The output lines OL1 and OL2 are logically combined with redundancy enable signals E1 and E2 respectively via AND gates 105. The results of the logical combinations are match signals, M1 and M2, which indicate when the current row address matches a redundant row address. A corresponding redundant address is thereby enabled. The match signals M1 and M2 are NOR-ed together via NOR gate 107 for generating an enable signal for regular word line drivers 106.

A global word line driver control signal WLC controls the timing for asserting both the regular and redundant word line drivers 106 and 108 respectively. The global word line driver control signal cannot be asserted until all the inputs to both the regular and redundant word line drivers, 106 and 108, have settled. The delay avoids glitching in any word lines and possibly corrupting data within the memory array. The earliest time at which it is possible to assert the global word line control signal WLC is defined by the sum of the clock-to-out delay of the address register 102 and the propagation delays of the address comparator C1 and the memory access signal combining NOR gate 107.

Therefore, as illustrated in the example above, the problem with conventional redundancy based repair of semiconductor memory is that it can limit the ability to achieve low access latency and a high rate of access operation. The delay is caused by the addition of a relatively long logic delay between the time the memory receives an address and the time the specified set of memory cells are accessed. A memory access cannot proceed until the address has been checked by all applicable enabled redundancy comparators and determined not to be the address of a defective element, thus increasing the delay. It is an object of the present invention to obviate and mitigate the above mentioned disadvantages.

SUMMARY OF THE INVENTION

In accordance with the present invention, there is provided a latched comparison circuit for generating complementary latched output signals. The latched comparison circuit comprises a comparator circuit for comparing an input address with a redundant address for generating a comparison output signal. The latched comparison circuit further comprises a flip-flop circuit coupled to the comparison output signal for latching the comparison output signal and for providing complementary latched comparison output signals in response to a clock signal.

In accordance with a further aspect of the invention there is provided a method for generating complementary latched output signals comprising the following steps. An input address is compared with a redundant address for generating a comparison output signal. The comparison output signal is latched in response to a memory clock signal for providing complementary latched comparison output signals.

In accordance with yet a further aspect of the invention there is provided a circuit for reducing a time delay between selecting a normal address and a redundant address in a memory device having normal and redundant memory elements. The circuit comprises a comparison circuit for comparing an input memory address with a redundant memory address for generating a comparison output signal. The circuit further comprises a flip-flop coupled with the comparison circuit for latching the comparison output signal in response to a memory clock signal. The comparison circuit compares the addresses before the memory clock signal is asserted.

BRIEF DESCRIPTION OF THE DRAWINGS

Embodiments of the present invention will be described by way of example only with reference to the following drawings in which:

FIG. 3b is a schematic diagram of a circuit for generating redundant signals used in the embodiment illustrated in FIG. 3a;

DETAILED DESCRIPTION OF THE PREFERRED EMBODIMENTS

Figure 1:
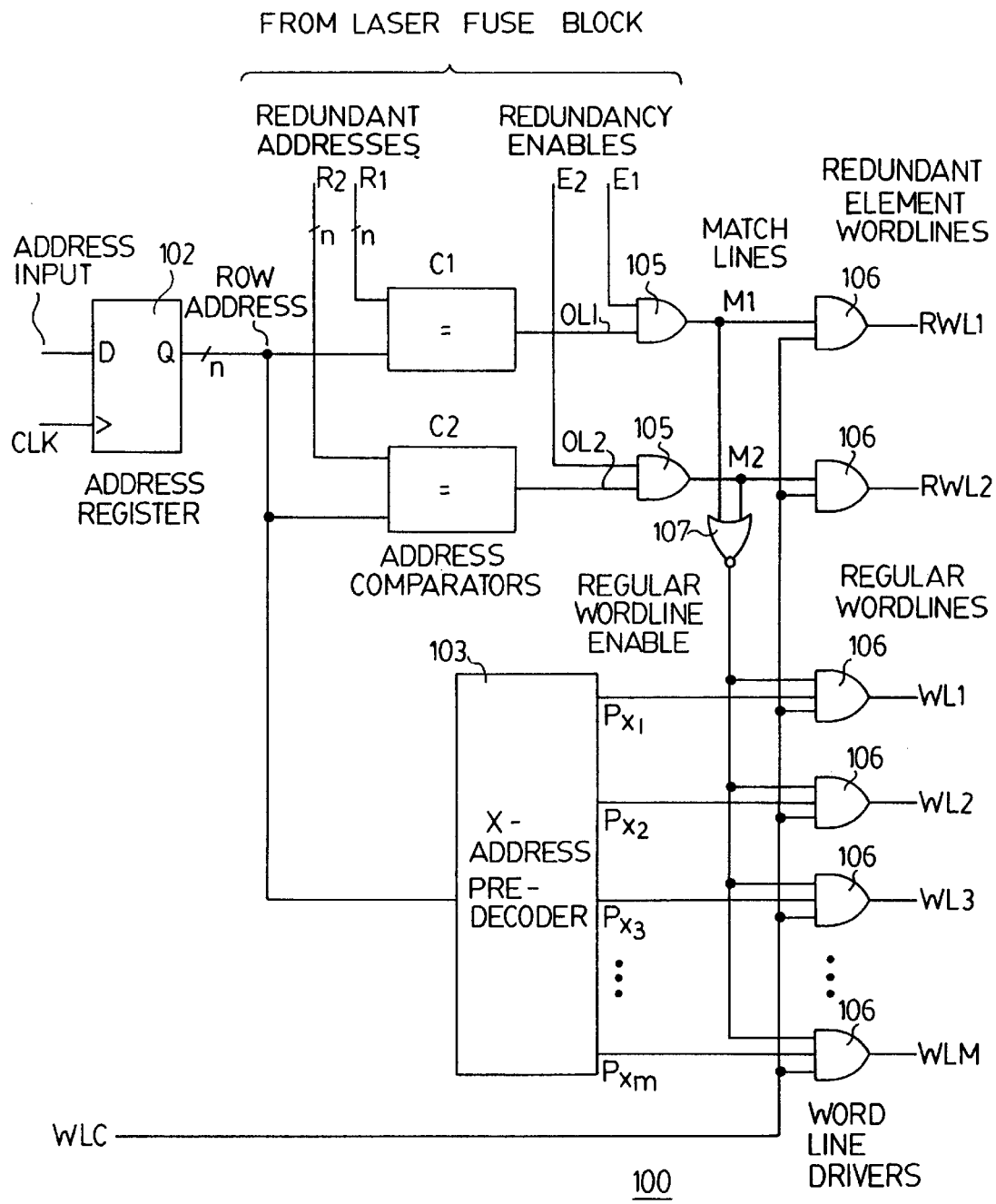
FIG. 1 is a schematic diagram of a circuit for implementing redundant address matching (prior art)
Figure 2:
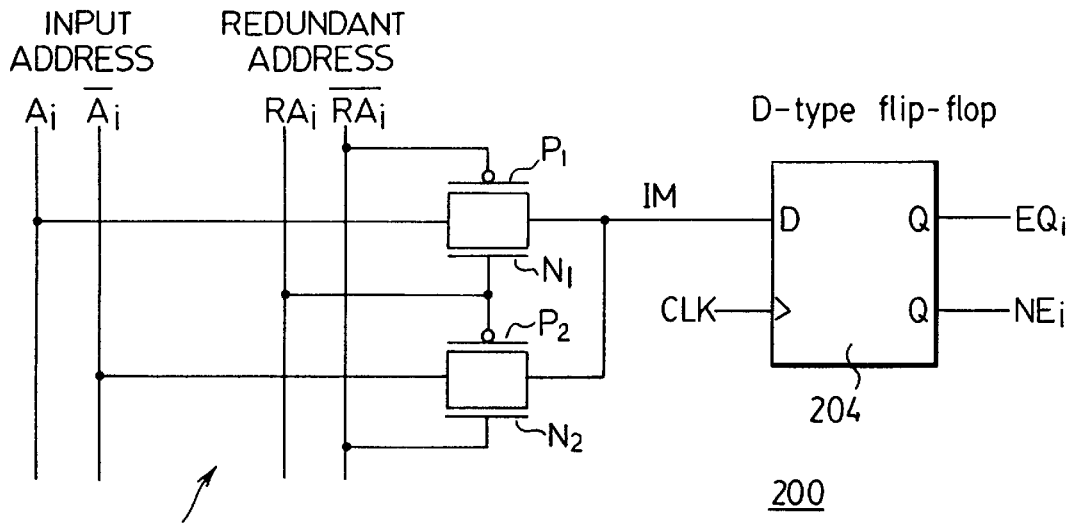
FIG. 2 is a schematic diagram of a comparator flip-flop.

Referring to FIG. 2, a one-bit comparator flip-flop according to an embodiment of the present invention is illustrated generally by numeral 200. The comparator flip-flop can be represented as having two parts, a comparison circuit 202 and a D-type flip-flop 204. The comparison circuit 202 is provided for comparing input address $A_i$ with redundant address $RA_I$ for bit i. The output of the comparison is comparison output signal IM. The comparison output signal IM is input to the D-type flip-flop 204 for latching the result.

In the present embodiment, the comparison circuit 202 comprises four transistors, the input address $A_i$, the complement of the input address $\overline{A_i}$, the redundant address $RA_i$, and the complement of the redundant address $\overline{RA_i}$. The input address $A_i$ is coupled to input D of the D-type flip-flop via an n-channel field effect transistor (FET) $N_1$ and a p-channel FET $P_1$. $N_1$ and $P_1$ are coupled together in parallel. $N_1$ is gated by the redundant row address $RA_i$ and $P_1$ is gated by the complement of the redundant row address $\overline{RA_i}$.

The complement of the input address $\overline{A_i}$ is coupled to the input D of the D-type flip-flop via an n-channel FET $N_2$ and a p-channel FET $P_2$. $N_2$ and $P_2$ are coupled together in parallel. $P_2$ is gated by the redundant row address $RA_i$ and $N_2$ is gated by the complement of the redundant row address $\overline{RA_i}$.

The operation of the comparator flip-flop 200 is described as follows. If the input address $A_i$ is asserted and the redundant address $RA_i$ is asserted then the comparison result is a match. Transistors $P_1$ and $N_1$ are enabled and the comparison output signal IM is asserted.

If the input address $A_i$ is low and the redundant address $RA_i$ is low then the comparison result is a match. Transistors $P_2$ and $N_2$ are enabled and the comparison output signal IM is asserted.

If the input address $A_i$ is asserted and the redundant address $RA_i$ is low then the comparison result is not a match. Transistors $P_2$ and $N_2$ are enabled and the comparison output signal IM is low.

If the input address $A_i$ is low and the redundant address $RA_i$ is asserted then the comparison result is a not match. Transistors $P_1$ and $N_1$ are enabled and the comparison output signal IM is low.

The D-type flip-flop 204 is provided for latching the result of the comparison. Such a flip-flop is standard in the art. After a memory clock signal CLK is asserted, the comparison output signal IM is propagated to output Q of the D-type flip-flop 204 and signal $EQ_i$. The complement of the comparison output signal IM is propagated to output $\overline{Q}$ of the D-type flip-flop 204 and signal $NE_i$.

Since the redundant addresses do not change after being programmed via laser fuses in the laser fuse box, their values are invariant. Therefore, individual bits of the invariant redundant addresses are used to combine the operation of a comparator (which is essentially an exclusive OR and exclusive NOR operation) with a D-type flip-flop. Input row address bits and redundant row address bits are compared before clocking the input row address into the comparator flip-flop 200. The comparison is performed without significantly adding to the data-to-clock setup time needed by the flip-flop 204. Once the comparator flip-flop 200 is clocked, the propagation delay inherent in checking for redundant memory addresses is reduced by the amount of time required to perform the comparison. Therefore, the time required to access the memory is reduced.

In an alternate embodiment, an enable-input function is added to the comparator flip-flop 200 described in the previous embodiment. The addition of the enable-input function allows the redundancy comparison to be forced to always fail. This feature allows unused redundancy comparators to be disabled without adding an enable term to the logic following the comparator flip-flops. The removal of a need for the enable term has the potential for further speed enhancements.

Figure 3A:
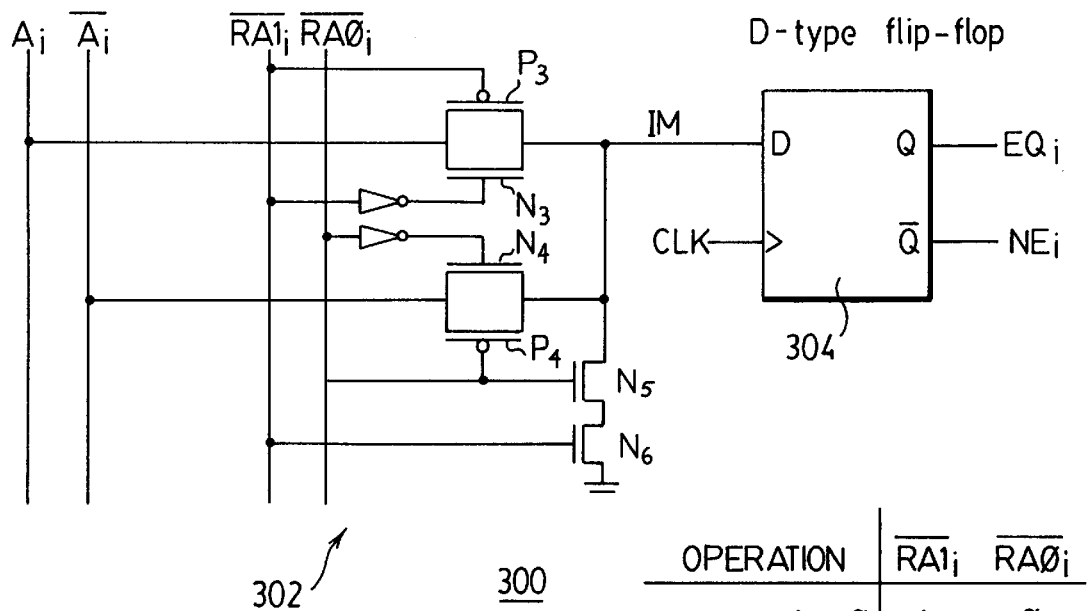
FIG. 3a is a schematic diagram of an alternate embodiment of the comparator flip-flop illustrated in FIG. 2.

Referring to FIG. 3a, a one-bit comparator flip-flop with an enable-input function according to an embodiment of the present invention is illustrated generally by numeral 300. As in the previous embodiment, the comparator flip-flop can be represented as having two parts, a comparison circuit 302 and a D-type flip-flop 304. The comparison circuit 302 is provided for comparing input address $A_i$ with either a logical 1 or a logical 0 for bit i. The output of the comparison is comparison output signal IM, which is input to the D-type flip-flop 304 for latching the result.

The comparator flip-flop with enable-input function 300 is comprised of six transistors, the input address $A_i$, the complement of the input address $\overline{A_i}$, and encoded redundant signals $\overline{RA1_i}$; and $\overline{RA0_i}$. The input address $A_i$ is coupled to the comparison output signal IM via an n-channel FET $N_3$ and a p-channel FET $P_3$. $N_3$ and $P_3$ are coupled together in parallel. $N_3$ is gated by the complement of signal $\overline{RA1_i}$ and $P_3$ is gated by $\overline{RA1_i}$.

The complement of the input address $\overline{A_i}$, is coupled to the comparison output signal IM via an n-channel FET $N_4$ and a p-channel FET $P_4$. $N_4$ and $P_4$ are coupled together in parallel. $P_4$ is gated by signal $\overline{RA0_i}$ and $N_4$ is gated by the complement of signal $\overline{RA0_i}$.

Furthermore, the comparison output signal IM is coupled to ground via n-channel FETs $N_5$ and $N_6$. $N_5$ is gated by signal $\overline{RA0_i}$ and $N_6$ is gated by signal $\overline{RA1_i}$.

The operation of the comparator flip-flop with enable-input function 300 is described as follows. If signal $\overline{RA0_i}$ is asserted, and signal $\overline{RA1_i}$ is low then the input address $A_i$ is compared with a logical 1. Transistors $P_3$ and $N_3$ are enabled and the value of input signal $A_i$ is presented at the comparison output signal IM.

If the input address $A_i$ is asserted, the result of the comparison is a match and the asserted signal $A_i$ is presented at the comparison output signal IM. If, however, the input address $A_i$ is low, the result of the comparison is not a match and the low signal $A_i$ is presented at the comparison output signal IM.

If signal $\overline{RA0_i}$ is low, and signal $\overline{RA1_i}$ is asserted then the input address $A_i$ is compared with a logical 0. Transistors $P_4$ and $N_4$ enabled and the value of input signal $\overline{A_i}$ is presented at the comparison output signal IM.

If the complement of the input address $\overline{A_i}$ is asserted, the result of the comparison is a match and the asserted signal $\overline{A_i}$ is presented at the comparison output signal IM. If, however, the complement of the input address $\overline{A_i}$ is low, the result of the comparison is not a match and the low signal $\overline{A_i}$ is presented at the comparison output signal IM.

If both signal $\overline{RA0_i}$ and signal $\overline{RA1_i}$ are asserted then $N_5$ and $N_6$ are turned on and the low ground signal is presented at the comparison output signal IM regardless of the value of $A_i$. Therefore, it is possible to disable the comparator by asserting signal $\overline{RA0_i}$ and signal $\overline{RA1_i}$.

Figure 3B:
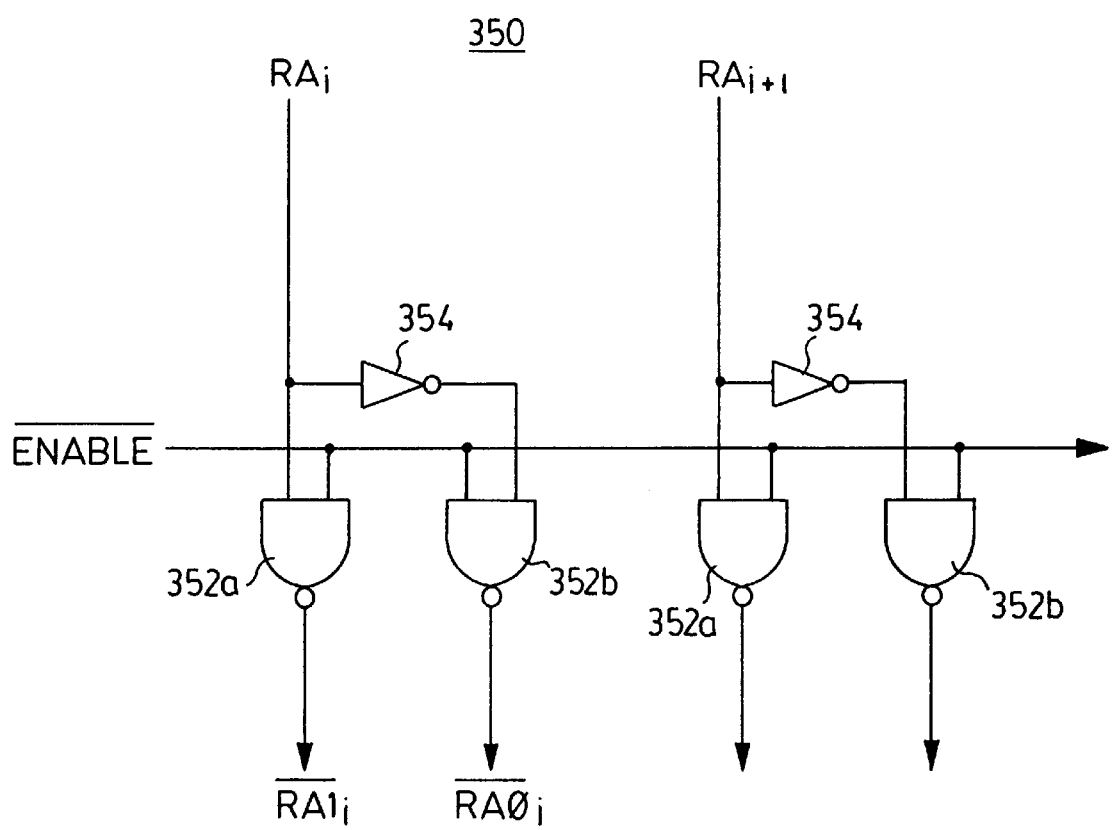

Referring to FIG. 3b, an example of a circuit for generating encoded redundant signals $\overline{RA0_i}$ and $\overline{RA1_i}$ is illustrated generally by numeral 350. For each of redundant address signal $RA_i$ there is a pair of two-input NAND gates 352a and 352b respectively. One input of the first NAND gate 352a is coupled to the redundant address $RA_i$ and the other is coupled to an enable signal $\overline{enable}$. One input to the second NAND gate 352b is coupled to the redundant address $RA_i$ via an inverter 354, and thus receives the complement of the redundant address $\overline{RA_i}$. The other input of the second NAND gate 352b is coupled to the enable signal $\overline{enable}$.

If the enable signal is active (i.e. the circuit is to be disabled), the outputs of both NAND gates 352a and 352b are high. If the enable signal is inactive and the redundant address signal is low, the output of NAND gate 352a is high and 352b is low. If the enable signal is inactive and the redundant address signal is high, the output of NAND gate 352a is low and 352b is high. The outputs of NAND gates 352a and 352b are encoded redundant addresses $\overline{RA0_i}$ and $\overline{RA1_i}$ respectively.

Figure 4:
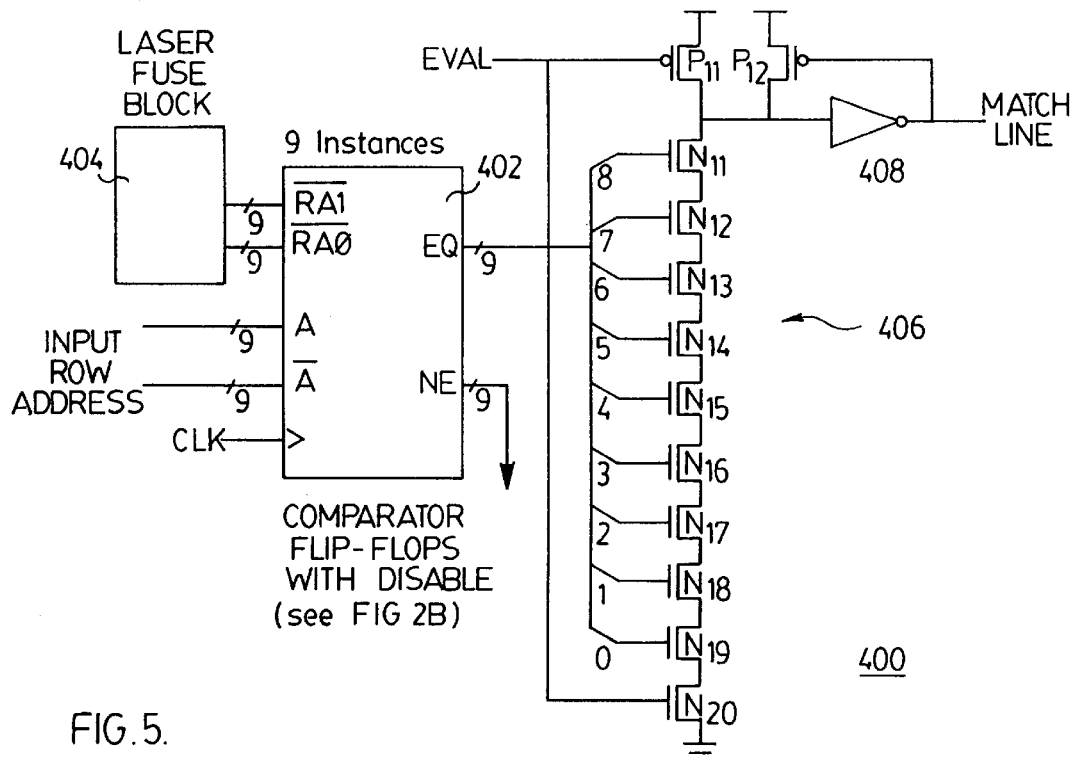
FIG. 4 is a schematic diagram of match line circuitry implementing the comparator flip-flop illustrated in FIG. 3.

Referring to FIG. 4, match line circuitry in accordance with an embodiment of the present invention is illustrated generally by numeral 400. An input row address signal A and its complement $\overline{A}$ are input to a comparator flip-flop 402. A signal $\overline{RA0}$ and its complement $\overline{RA1}$ are provided from a laser fuse block 404 and input to the comparator flip-flop 402. In the present example, the size of the address signal is selected as nine bits for illustrative purposes only. The comparator flip-flop 402 therefore comprises nine one-bit comparator flip-flops 300 operating in parallel. The comparator flip-flop 402 performs an asynchronous bit-wise comparison of the input row address and redundant row address.

The comparator flip-flop 402 is clocked by the memory clock signal CLK and outputs a match signal EQ and its complement NE. The match signal EQ is input to a match signal logic circuit 406. If the input row address and the redundant row address are equivalent, the match signal logic circuit 406 asserts a redundant memory select signal M. The redundant memory select signal M is used for enabling the redundant memory elements as in the prior art.

In the present embodiment, the match signal logic circuit 406 is implemented using dynamic logic. The match signal logic circuit 406 is a dynamic NAND gate comprising nine serially connected n-channel FETs $N_{11}$ to $N_{19}$. Each of the FETs $N_{11}$ to $N_{19}$ is gated by a corresponding one of the bits output from the comparator flip-flop 402. The FETs $N_{11}$ to $N_{19}$ are coupled at one end to ground via a tenth n-channel FET $N_{20}$ and at another end to the redundant memory select signal M via an inverter 408. The input of the inverter 408 is also coupled to a supply voltage via p-channel FETs $P_{11}$ and $P_{12}$. FET $P_{12}$ is gated by the output of the inverter 408. FETs $P_{11}$ and $N_{20}$ are gated by signal EVAL.

The EVAL signal is a self-timed delayed signal provided from a self-timed circuit (not shown). When asserted logic high, the EVAL signal enables the dynamic NAND gate 406 to evaluate all inputs to FETs $N_{11}$ to $N_{19}$. When asserted logic low, the EVAL signal resets the output of circuit 406 to logic high through the pull up p-channel FET $P_{11}$. An enable signal for the regular word line decoders is generated by NOR-ing all the redundancy address comparator redundant memory select signals together as is standard in the art.

Although the present embodiment is described using a match signal logic circuit 406 implemented using dynamic logic, other implementations will be apparent to a person skilled in the art. These implementations include alternate layouts of the dynamic logic devices as well as the use of other logic elements such as fast static logic devices.

Figure 5:
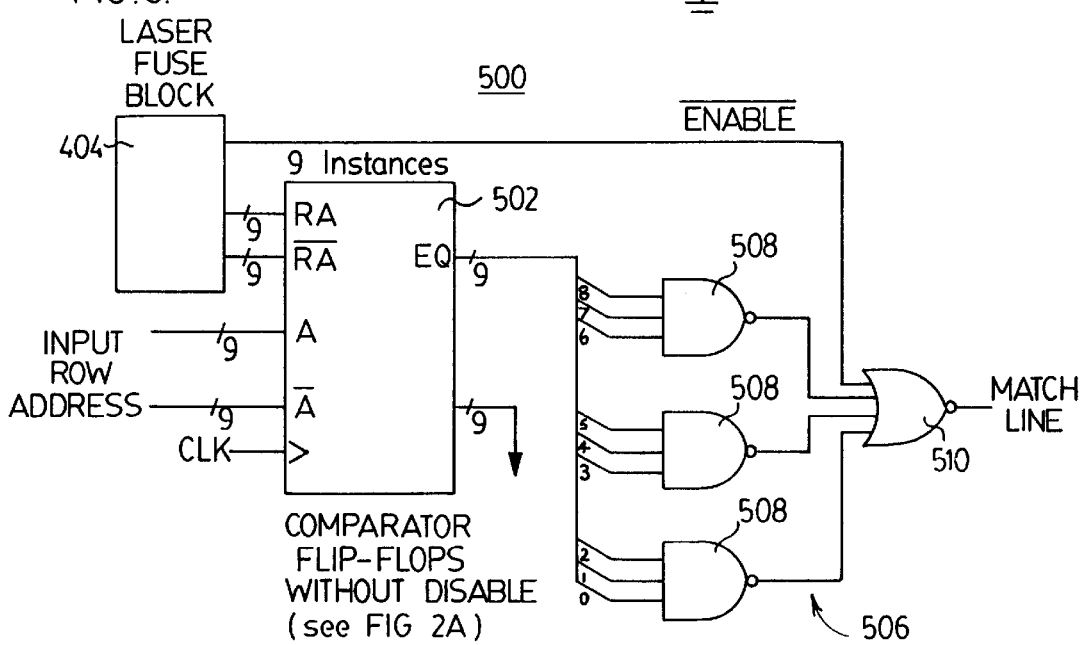
FIG. 5 is a schematic diagram of an alternate embodiment of match line circuitry implementing the comparator flip-flop illustrated in FIG. 2.

Referring to FIG. 5, match line circuitry in accordance with an alternate embodiment of the present invention is illustrated generally by numeral 500. The input row address signal A and its complement $\overline{A}$ are input to a comparator flip-flop 502. A redundant row address signal RA and its complement $\overline{RA}$ are provided from a laser fuse block 404 and input to the comparator flip-flop 502. In the present example, the size of the address signal is selected as nine bits for illustrative purposes only. The comparator flip-flop 502 therefore comprises nine one-bit comparator flip-flops 200 operating in parallel. The comparator flip-flop 502 performs an asynchronous bit-wise comparison of the input row address and redundant row address.

The comparator flip-flop 502 is clocked by a clock signal CLK and outputs a match signal EQ and its complement NE. The match signal EQ is input to a match signal logic circuit 506. The enable signal $\overline{enable}$ from the laser fuse block 404 is input to the match signal logic circuit 506.

If the input row address and the redundant row address are equivalent, and the enable signal is active, the match signal logic circuit 506 asserts a redundant memory select signal M. The redundant memory select signal M is used for selecting the redundant memory elements as in the prior art.

In the present embodiment, the match signal logic circuit 506 comprises fast static logic circuitry. In particular, the circuit uses a static logic tree of several NAND gates 508 followed by a NOR gate 510. Each of the NAND gates 508 has three inputs for receiving three bits from the bit-wise comparison of the input address signal A and the redundant address signal RA. The NOR gate 510 has four inputs for the receiving each output from the NAND gates 508 and the enable signal $\overline{enable}$. The output of the NOR gate 510 is the redundant memory select signal M.

An enable signal for the regular word line decoders is generated by NOR-ing all the redundancy address comparator redundant memory select signals together as is standard in the art.

Although the present embodiment is described using a match signal logic circuit 506 implemented using fast static logic, other implementations will be apparent to a person skilled in the art. These implementations include alternate layouts and tree structures of the fast static logic devices as well as the use of other logic elements such as dynamic logic devices.

Figure 6:
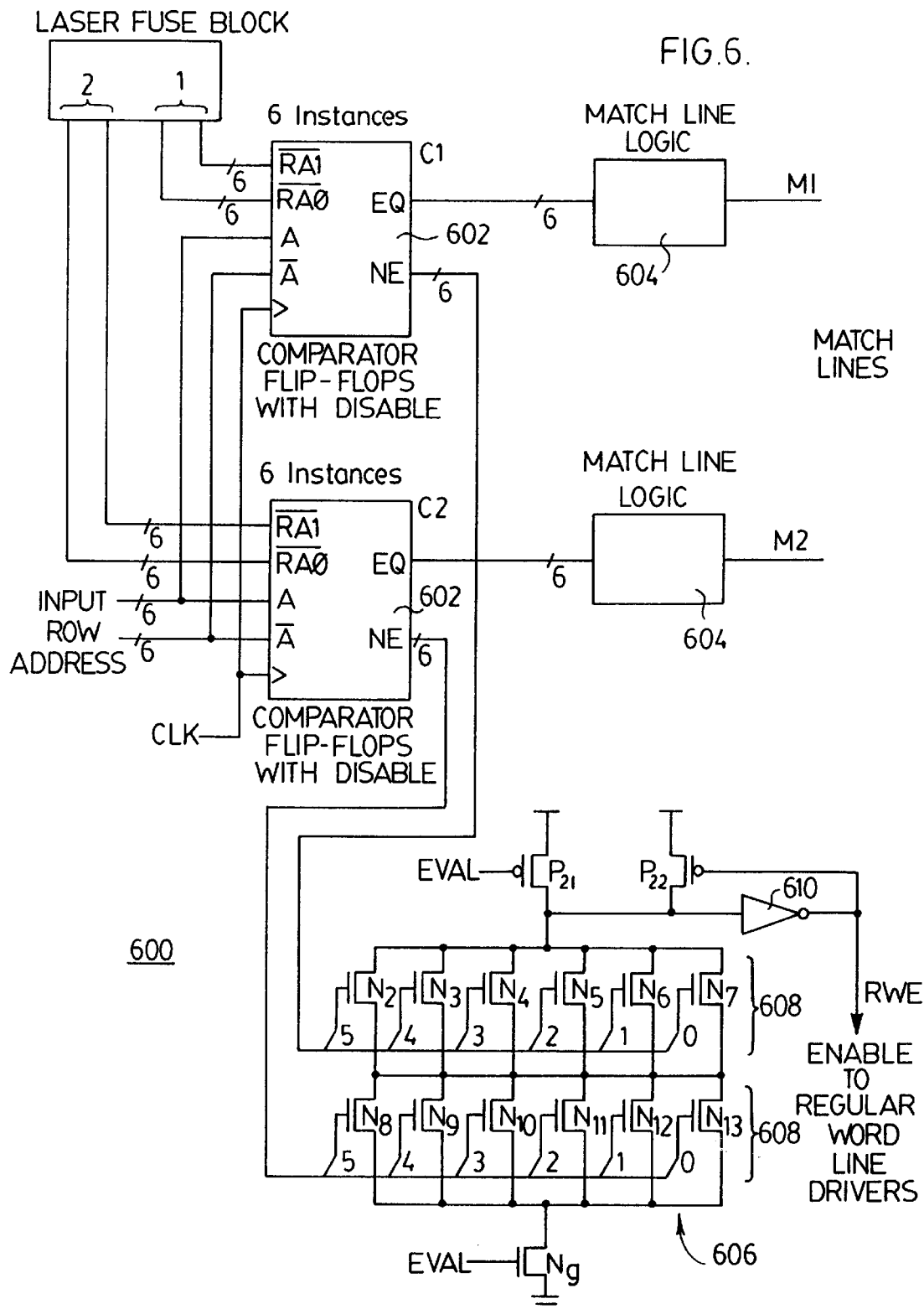
FIG. 6 is a schematic diagram of a circuit using the output of a comparator flip-flop for generating a regular word line enable signal.

In yet an alternate embodiment, the regular word line enable signal is generated from result of the comparator flip-flops. Referring to FIG. 6, a circuit for providing the regular word line enable signal is represented generally by numeral 600. In the present embodiment, the address size is selected as six bits for simplicity. The output EQ from comparator flip-flops 602 is coupled to corresponding match signal logic circuits 604 as described in previous embodiments. The output NE from comparator flip-flops 602 is coupled to a regular word line enabling circuit 606.

The regular word line enabling circuit 606 is comprised of two sets of n-channel FETs 608. Each set 608 comprises six n-channel FETs connected in parallel. The FETs in each set are gated by a corresponding bit from the output NE of a corresponding comparator flip-flop 602. The sets 608 are coupled together in series. One end of the serially connected sets is coupled to ground via an n-channel FET $N_g$ and the other end is coupled to the input of an inverter 610.

The input of the inverter is further coupled to a supply voltage via two p-channel FETs $P_{21}$ and $P_{22}$. FETs $P_{21}$ and $N_g$ are gated by an EVAL signal and $P_{22}$ is gated by the inverter's output. The output of the inverter 610 is the enable signal RWE provided to the regular word line drivers. The enable signal RWE is only be sent to the regular word line drivers if the input address does not match any of the redundant address.

Only two sets are used in the present embodiment for simplicity. Typically, the number of sets required is equivalent to the number of redundant memory elements used. Furthermore, although the present embodiment is described using dynamic logic, other implementations will be apparent to a person skilled in the art.

In yet an alternate embodiment, a comparator flip-flop performs a plurality of comparisons per D-type flip-flop as compared to the single comparison per flip-flop described in the previous embodiments.

Figure 7:
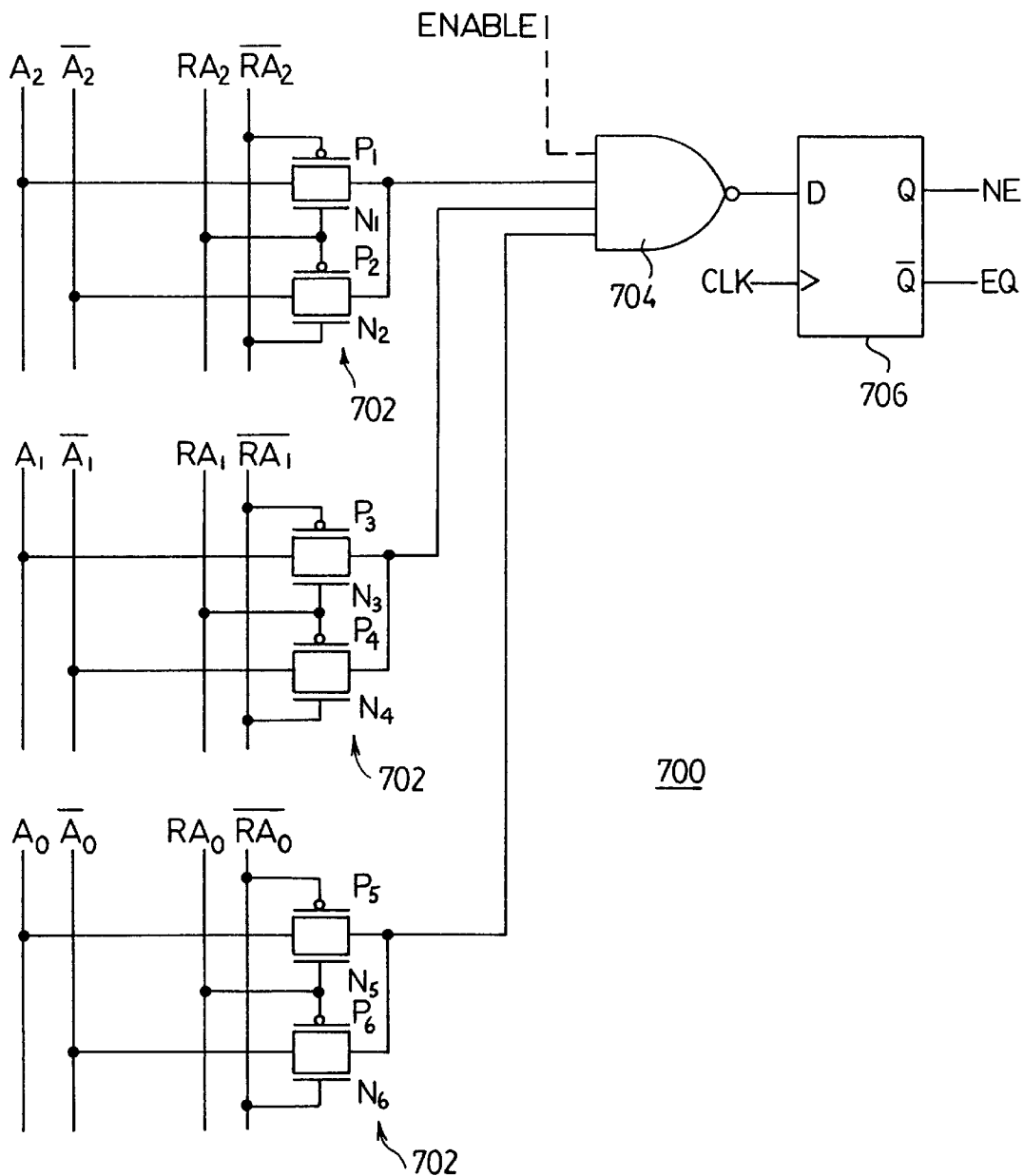
FIG. 7 is a schematic diagram of an alternate embodiment of the comparator flip-flops shown in FIGS. 2 and 3.

Referring to FIG. 7, a comparator flip-flop for comparing three bits of the input address and redundant address and latching the result is illustrated generally by numeral 700. The outputs of three comparison circuits 702 are coupled to a NAND gate 704. The output of the NAND gate 702 is coupled to the comparison output signal IM, which is coupled to the input D of the D-type flip-flop 706. In the present embodiment, the output Q of the D-type flip-flop 706 is low only if all three bits being compared are equivalent.

The total number of D-type flip-flops 706 required for a given row address size and for a number of redundancy comparators is reduced. Furthermore, the logic between the comparator flip-flops 700 and the redundant memory select enable signal M is simplified even further than previous embodiments. It may also be possible to achieve even further access speed enhancements since there is less propagation delay between the comparator flip-flop and the redundant memory select enable signal M.

In FIG. 7, the comparison circuit 702 is shown as the comparison circuit 202 without the enable-input function for illustrative purposes only. It is possible to provide an enable-input function to comparator flip-flip 700 by the addition of an enable signal enable. The enable signal enable is provided as an input to the NAND gate 704 for disabling the comparison as desired. Alternately, it is possible to substitute the comparison circuit 702 with the previously described comparison circuit 302 with the enable-input function.

Although the invention has been described with reference to certain specific embodiments, various modifications thereof will be apparent to those skilled in the art without departing from the spirit and scope of the invention as outlined in the claims appended hereto. For example, n-channel FETs can be replaced by p-channel FETs and vice versa if the polarity of the gate signal voltage is reversed. Alternately, other pass transistors can be implemented instead of FETs, as will be appreciated by a person skilled in the art. Furthermore, the invention is applicable to any type of electronic memory that utilizes redundant storage elements for increasing efficient yield. These include, but are not limited to SRAM and various non-volatile memories such EPROM, EEPROM, flash EPROM, and FRAM.

The embodiments of the invention in which an exclusive property or privilege is claimed are defined as follows:

1. A latched comparison circuit for generating complementary latched output signals, said latched comparison circuit comprising:
   (a) a comparator circuit for comparing an input address with a redundant address for generating a comparison output signal; and
   (b) a flip-flop circuit coupled to said comparison output signal for latching said comparison output signal and for providing complementary latched comparison output signals in response to a clock signal.

2. A circuit as defined in claim 1, wherein a predetermined number of comparator circuits are coupled to one flip-flop via a logic element, thereby reducing the number of said flip-flops required for said predetermined number of comparator circuits.

3. A circuit as defined in claim 1, wherein an enable signal is provided for enabling or disabling the comparison.

4. A circuit as defined in claim 3, wherein said enable signal disables said comparison circuit by always forcing said comparison to a predetermined value.

5. A circuit as defined in claim 4, wherein said enable signal is logically combined with said redundant address for providing an encoded redundant signal and said comparison circuit compares said encoded redundant signal with said input address, said encoded redundant signal representing either the redundant address or a value that forces said comparison to a predetermined value.

6. A circuit as defined in claim 2, wherein an enable signal is provided for enabling or disabling the comparison, said enable signal being an additional input to said logic element.

7. A circuit as defined in claim 1, wherein said circuit further comprises a matching circuit coupled with a plurality of outputs of said flip-flop circuits for generating a redundant memory select signal for selecting a corresponding redundant memory element in accordance with said plurality of outputs of said flip flop circuits.

8. A circuit as defined in claim 7, wherein said matching circuit determines whether said plurality of outputs of said flip flop circuits indicates a match between said input memory address and said redundant memory address, said matching circuit generating said redundant memory select signal if said plurality of outputs of said flip flop circuits indicate a match.

9. A circuit as defined in claim 7, wherein said matching circuit is comprised of static logic gates.

10. A circuit as defined in claim 7, wherein said matching circuit is comprised of dynamic logic gates.

11. A circuit as defined in claim 7, wherein said matching circuit further includes a word line enabling circuit coupled to a plurality of outputs of said flip-flop circuits for generating an enable signal for a plurality of regular word line drivers in accordance with said comparison output signals.

12. A method for generating complementary latched output signals comprising the steps of:
   (a) comparing an input address with a redundant address for generating a comparison output signal; and
   (b) latching said comparison output signal in response to a memory clock signal for providing complementary latched comparison output signals.

13. A circuit for reducing a time delay between selecting a normal address and a redundant address in a memory device having normal and redundant memory elements, said circuit comprising:
   (a) a comparison circuit for comparing an input memory address with a redundant memory address for generating a comparison output signal; and
   (b) a flip-flop coupled with said comparison circuit for latching said comparison output signal in response to a memory clock signal, wherein said comparison circuit compares said addresses before said memory clock signal is asserted.

\* \* \* \* \*